(12) United States Patent
Turner et al.

(10) Patent No.: US 11,824,533 B1
(45) Date of Patent: Nov. 21, 2023

(54) LEVEL-CONVERSION CIRCUITS UTILIZING LEVEL-DEPENDENT INVERTER SUPPLY VOLTAGES

(71) Applicant: NVIDIA Corp., Santa Clara, CA (US)

(72) Inventors: Walker Joseph Turner, Jacksonville, FL (US); John Poulton, Chapel Hill, NC (US); Sanquan Song, Mountain View, CA (US)

(73) Assignee: NVIDIA CORP., Santa Clara, CA (US)

( * ) Notice: Subject to any disclaimer, the term of this patent is extended or adjusted under 35 U.S.C. 154(b) by 0 days.

(21) Appl. No.: 17/814,752

(22) Filed: Jul. 25, 2022

(51) Int. Cl.
*H03K 19/0185* (2006.01)
*H03K 3/037* (2006.01)

(52) U.S. Cl.
CPC ..... *H03K 19/018528* (2013.01); *H03K 3/037* (2013.01); *H03K 19/018521* (2013.01)

(58) Field of Classification Search
CPC ......... H03K 19/018507–018528; H03K 3/037
See application file for complete search history.

(56) References Cited

U.S. PATENT DOCUMENTS

| | | | | |
|---|---|---|---|---|
| 7,746,121 B2* | 6/2010 | Khoury | ............ | H03K 19/01707 327/108 |
| 2014/0218070 A1* | 8/2014 | Viani | ............. | H03K 19/018521 326/80 |
| 2017/0093403 A1* | 3/2017 | Wilson | ............ | H03K 19/018528 |

OTHER PUBLICATIONS

J. M. Wilson et al., "A 6.5-to-23.3fJ/b/mm Balanced Charge-Recycling Bus in 16nm FinFET CMOS at 1.7 to-2.6GB/s/wire with Clock Forwarding and Low-Crosstalk Contraflow Wiring," IEEE International Solid-State Circuits Conference, vol. 59, pp. 156-157, Feb. 2016.

* cited by examiner

*Primary Examiner* — Patrick O'Neill
(74) *Attorney, Agent, or Firm* — Rowan TELS LLC

(57) ABSTRACT

Voltage level conversion circuits include PMOS pull-down devices or NMOS pull-up devices, and inverters with outputs that determine gate voltages of these devices. The inverters are powered by moving supply voltages, for example complementary supply voltages generated from a pair of cross-coupled inverters. The cross-coupled inverters may implement a data storage latch with the moving supply voltages generated from the internal data storage nodes of the latch.

20 Claims, 9 Drawing Sheets

LEVEL-CONVERSION CIRCUITS UTILIZING LEVEL-DEPENDENT INVERTER SUPPLY VOLTAGES

GOVERNMENT LICENSE RIGHTS

This invention was made with US Government support under LLNS subcontract B609487 (FastForward2 Node) awarded by DOE. The US Government has certain rights in this invention.

BACKGROUND

Voltage level conversion is utilized to propagate signals between circuits that are operating in different voltage domains, such as electronic interfaces and charge recycling fabrics. Conventional level conversion mechanisms utilize NMOS pull-down transistors or PMOS pull-up transistors to alter the logic state of a storage element, typically a latch, that is operating in the voltage domain of the output signal. The level conversion speed of conventional mechanisms is often constrained by the gate-to-source voltage (VGS) of the pull-down and/or pull-up transistors with respect to the magnitude of the lower supply voltage. This constrains the practical operational frequency range of such circuits.

Power saving techniques such as charge recycling data fabrics use stacked digital circuitry to transmit data within two-voltage domains (e.g., $V_{dd}$ and $V_{dd}/2$, and $V_{dd}/2$ and GND, where $V_{dd}$ represents circuit supply voltage and GND represents circuit ground). The transmitted signals may be level-converted between voltage domains to maintain charge balance on a non-regulated $V_{dd}/2$-level node.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
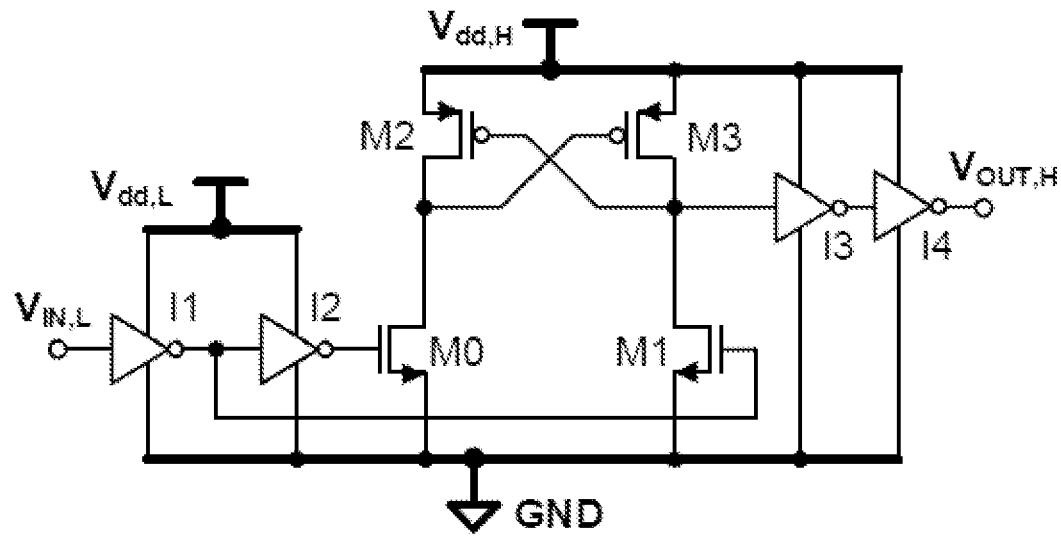
FIG. 1 depicts an embodiment of a level-shifting circuit for transitioning digital signals from a lower voltage domain to a higher voltage domain.

Disclosed herein are embodiments of circuitry for converting signal levels between low-to-high and high-to-low voltage domains within electronic interfaces and charge recycling implementations. These circuits increase the effective gate-to-source voltages (VGS) of pull-down and pull-up control transistors by utilizing PMOS and NMOS devices, respectively. Due to the complementary operation of these control transistors, the gate voltages may be set by inverters with moving supply voltages to increase the applied VGS while ensuring the control transistors are effectively switched off in the inactive state. A "moving supply voltage" is a dynamic (during circuit operation) change in the differential voltage between a power supply voltage applied (e.g., at a VDD terminal) to the circuit, and a circuit ground voltage applied (e.g., at a VSS terminal) of the circuit. The ground voltage may or may not be earth ground. The moving supply voltage to an inverter may be implemented by connecting either supply terminal (i.e., VDD terminal or VSS terminal) of the inverter to the source terminal of a control transistor.

Embodiments of the disclosed circuits may utilize PMOS and NMOS devices, respectively, as the pull-down and pull-up transistors to control a storage latch state, as opposed to conventional methods utilizing PMOS and NMOS devices as the pull-up and pull-down devices, respectively. This approach enables a gate-to-source voltage for the control transistors proportional to the full-scale voltage range of the circuit, increasing the level-conversion speed.

The disclosed mechanisms may be adopted within data links to increase the performance of low-power signaling techniques. For example, the mechanisms may be utilized within charge recycling fabrics where periodic swapping of signals between the high and low voltage domains is utilized to maintain charge balance on a non-regulated middle supply node. The mechanisms may also be adapted for utilization within conventional level conversion interfaces when transmitting signals between systems that operate at different supply voltages.

Herein, a transistor is referred to as a "pull-down" transistor if it operates as a bridge (via source-to-drain connection for a PMOS device or via a drain-to-source connection for an NMOS device) between a first circuit node configured to transition to a first voltage level and a second circuit node that is tied to a second, constant voltage level lower than the first voltage level. During circuit operation, the first voltage level may transition between a supply voltage level $V_{dd}$ and $V_{dd}/2$ (for example), and the second voltage level may remain constant at $V_{dd}/2$, for example. Or, the first voltage level may transition between $V_{dd}/2$ and a circuit ground level (GND, for example) and the second voltage level may be tied to GND.

Herein, a transistor is referred to as a "pull-up" transistor if it operates as a bridge (via source-to-drain connection for an NMOS device or via a drain-to-source connection for an PMOS device) between a first circuit node configured to transition to a first voltage level and a second circuit node that is tied to a second, constant voltage level higher than the first voltage level. The first voltage level may transition between approximately $V_{dd}/2$ and $V_{dd}$, for example, and the second voltage level may be tied to $V_{dd}$. Or, the first voltage level may transition between approximately circuit ground (GND) and approximately $V_{dd}/2$, and the second voltage level may be tied to $V_{dd}/2$, for example.

Herein reference is made to a "moving supply voltage" for inverters. This refers to a supply node for the inverters (not an input node or output node) configured such that an applied voltage at the power supply or grounding node changes during operation. For example a moving supply voltage may be provided to the inverters from an internal node of a larger circuit (as opposed to a supply voltage provided from a constant-value supply rail, specific examples of these being a $V_{dd}$ level supply rail and a $V_{dd}/2$ level supply rail).

FIG. 1 depicts a conventional level-shifting circuit for low-to-high signal level shifting. In other words, the circuit may be utilized to propagate signals from circuit domains operating from a lower supply voltage to a circuit domain operating from a higher supply voltage, without loss or corruption of the "logic level" of the signal (e.g., "1" or "0").

NMOS pull-down transistors (M0 and M1) are used to toggle the stored state within cross-coupled PMOS transistors (M2 and M3) powered by the higher supply voltage ($V_{dd,H}$). The gate voltages of M0 and M1 are controlled by inverters (I2 and I1 respectively) having constant supply voltages provided from the lower voltage domain ($V_{dd,L}$). This arrangement constrains the gate-to-source control voltages of the NMOS pull-down transistors to the range $V_{dd,L}$:0V. Because the NMOS devices have to overcome the positive feedback within the cross-coupled pair, whose VGS magnitude range is $V_{dd,H}$:0V, the level-conversion speed is constrained by the transistor threshold voltages and the ratio of $V_{dd,H}$ to $V_{dd,L}$.

Figure 2:
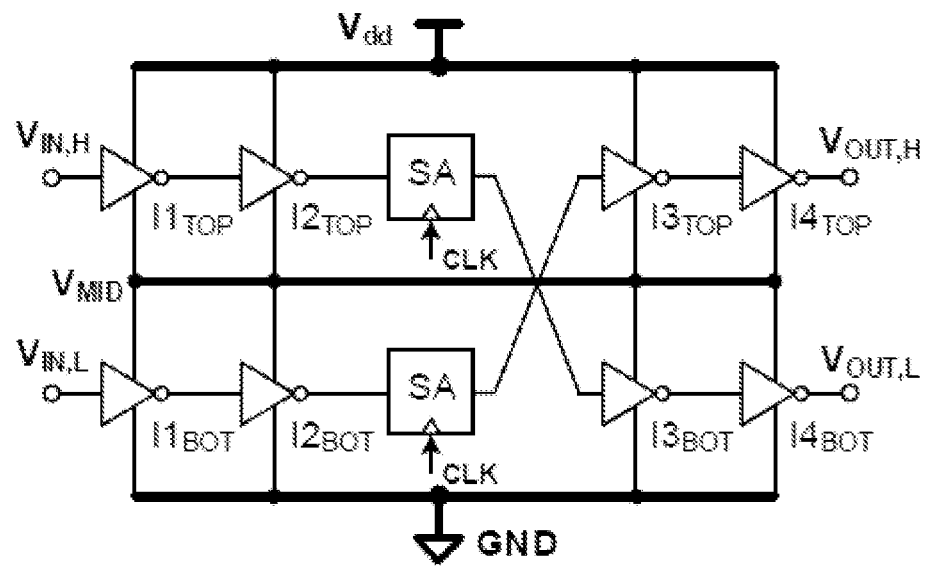
FIG. 2 depicts another embodiment of a level-shifting circuit for transitioning digital signals from a lower voltage domain to a higher voltage domain.

FIG. 2 depicts a charge recycling data link, where data signals are transitioned utilizing stacked inverters. The data signals are periodically swapped between supply voltage domains to maintain charge balance on the floating $V_{MID}$ node. So called "strong arm" (SA) latches, which are components familiar to those of skill in the art, operate at the full voltage range ($V_{dd}$ to GND) to latch and level-shift the half-swing data signals between the supply voltage domains.

Figure 3A:
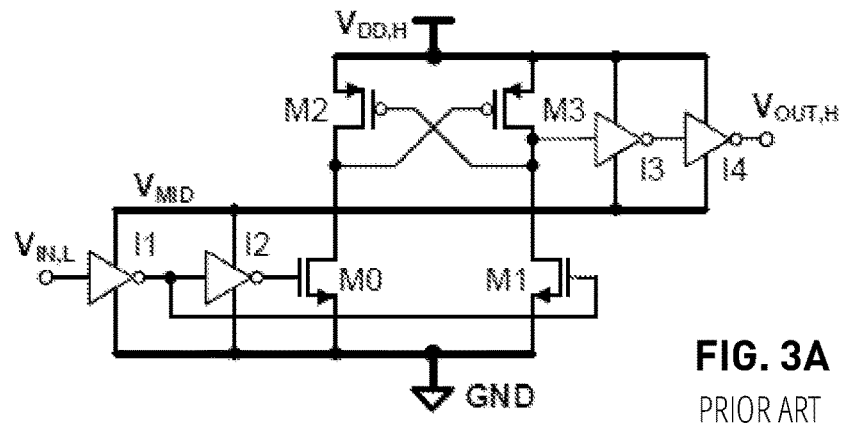
FIG. 3A and FIG. 3B depict charge recycling embodiments of a level-shifting circuit for transitioning digital signals from a lower voltage domain to a higher voltage domain and vice-versa, respectively.
Figure 3B:
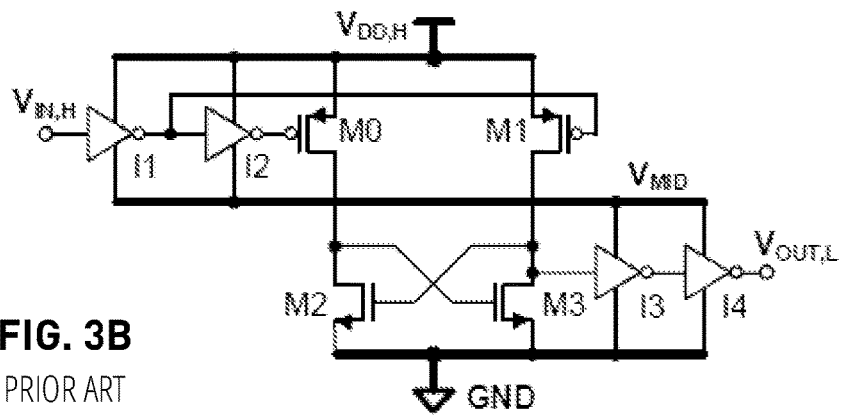

Other mechanisms have to be developed to implement latches capable of providing fast level conversion speeds. FIG. 3A and FIG. 3B depict circuits that translate signals low-to-high and high-to-low between supply voltage domains, respectively. The level conversion speed of these mechanisms is restricted because a maximum VGS of $V_{dd}/2$ is applied to the pull-down and pull-up devices. A benefit of these mechanisms is that unlike the embodiment of FIG. 2, they do not utilize clocking to swap signals between voltage domains, saving power.

Figure 4A:
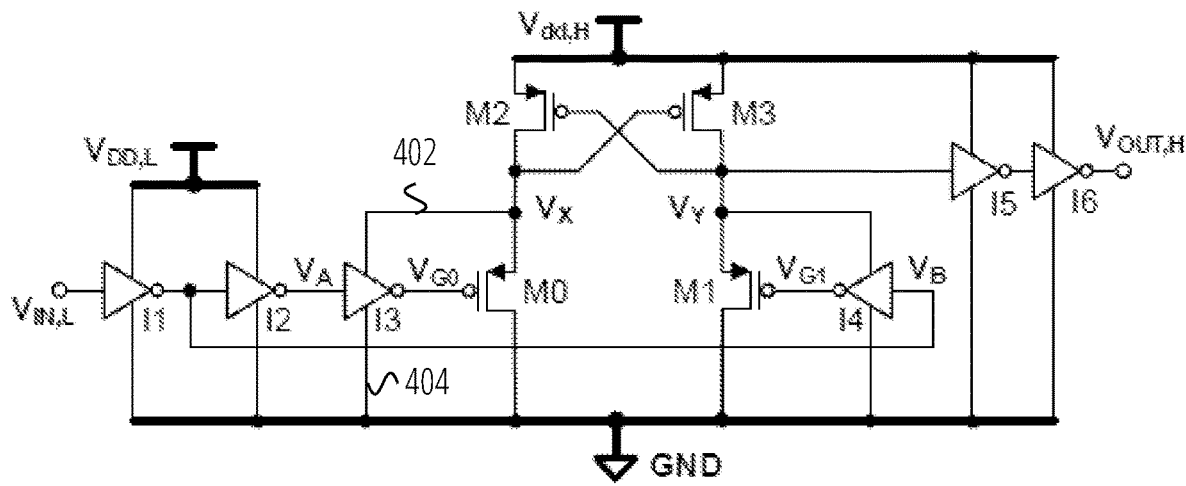
FIG. 4A and FIG. 4B depict an embodiment and waveforms, respectively, for a level-shifting circuit for transitioning digital signals from a lower voltage domain to a higher voltage domain.
Figure 4B:
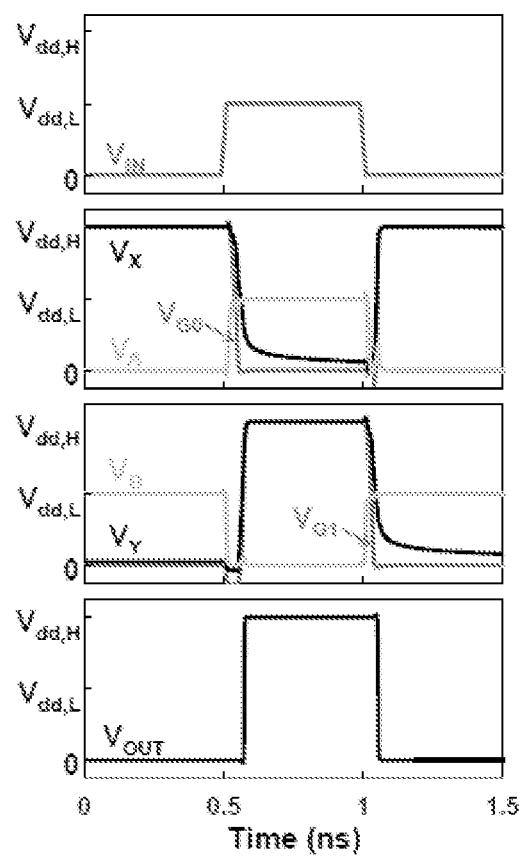

FIG. 4A and FIG. 4B depict a circuit embodiment and waveforms, respectively, for a low-to-high voltage domain level signal converter that addresses constraints of the conventional approaches. The circuit depicted in FIG. 4A applies PMOS transistors as pull-down devices (M0 and M1) to control the state of the cross-coupled PMOS storage elements (M2 and M3). The gate voltages of M0 and M1 are controlled by inverters I3 and I4, whose supply voltages are tied to the source of the respective pull-down device. The VDD terminal 402 and VSS terminal 404 of one of the control inverters (I3) are numbered for ease of reference.

When the input signal $V_{IN,L}$ transitions to logic high ($V_{IN,L}$: 0V→$V_{dd,L}$ where $V_X=V_{dd,H}$, $V_Y\approx$0V, and $V_{OUT,H}$=0V), the gate of M0 is coupled to 0V through inverter I3 to apply a VGS ($V_X$–$V_{G0}$) of approximately $V_{dd,H}$. In this state, M0 sinks current to pull node $V_X$ towards 0V while the positive feedback within transistors M2 and M3 pull node $V_Y$ towards $V_{dd,H}$. As the intermediate signals transition, inverter I4 applies a control voltage ($V_{G1}$) to the gate of M1 that follows the $V_Y$ node such that a VGS of 0V is maintained to ensure the transistor remains off.

When the input signal $V_{IN,L}$ transitions to logic low ($V_{IN,L}$: $V_{dd,L}$→0V where $V_X\approx$0V, $V_Y=V_{dd,H}$, and $V_{OUT,H}=V_{dd,H}$), a VGS equal to 0V and $V_{dd,H}$, respectively, is applied to transistors M0 and M1, respectively, to pull node $V_Y$ towards 0V and to toggle the output $V_{OUT,H}$ to logic low (0V).

Figure 10A:
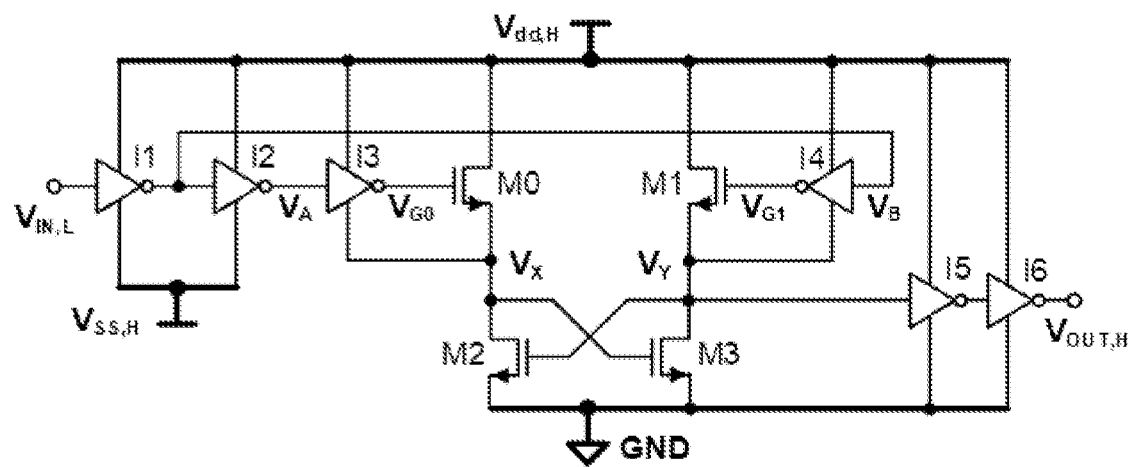
FIG. 10A and FIG. 10B depict an embodiment and waveforms, respectively, for a level-shifting circuit for transitioning digital signals from a higher ground voltage domain to a lower ground voltage domain.
Figure 10B:
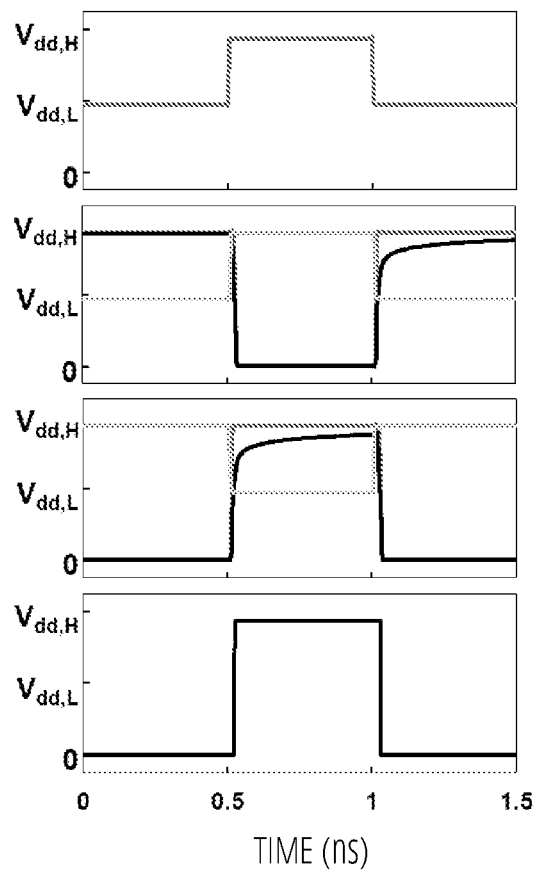

FIG. 10A and FIG. 10B depict an embodiment and waveforms, respectively, for a level-shifting circuit for transitioning digital signals from a higher ground voltage domain to a lower ground voltage domain. This embodiment is complementary to the one depicted in FIG. 4A. It will be readily apparent to those of skill in the art that a similar embodiment utilizing cross-coupled inverters could be implemented as per the teachings in FIG. 5A below.

In the embodiment of FIG. 4A, the pull-down transistors sink current to drive internal nodes $V_X$ and $V_Y$ toward 0V and to toggle the output signal state. However, as these internal nodes approach 0V, the VGS of the corresponding control transistor (M0 or M1) decreases, and the transistor is unable to pull the node voltage all the way to 0V. This inefficiency may be rectified by the circuit embodiment depicted in FIG. 5A, with corresponding waveforms depicted in FIG. 5B.

Figure 5A:
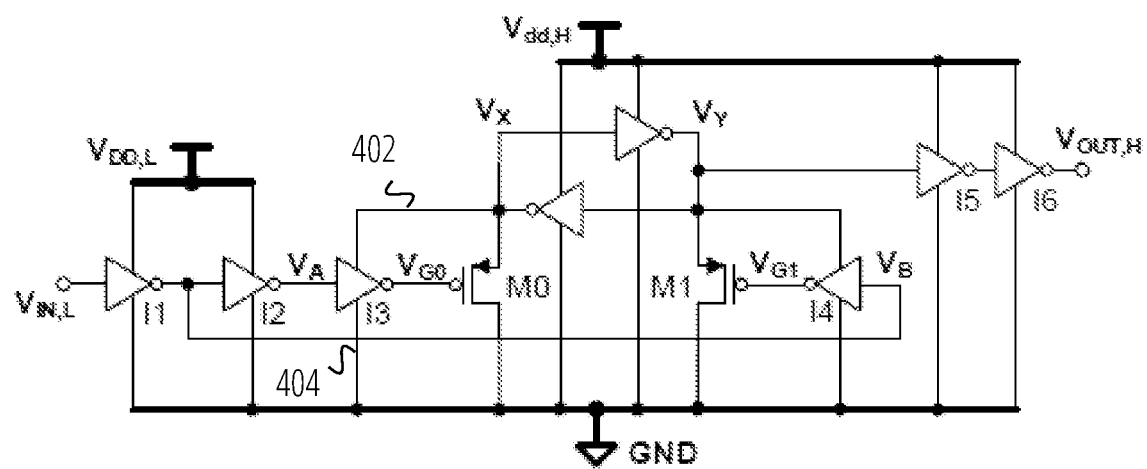
FIG. 5A and FIG. 5B depict another embodiment and waveforms for a level-shifting circuit for transitioning digital signals from a lower voltage domain to a higher voltage domain.
Figure 5B:
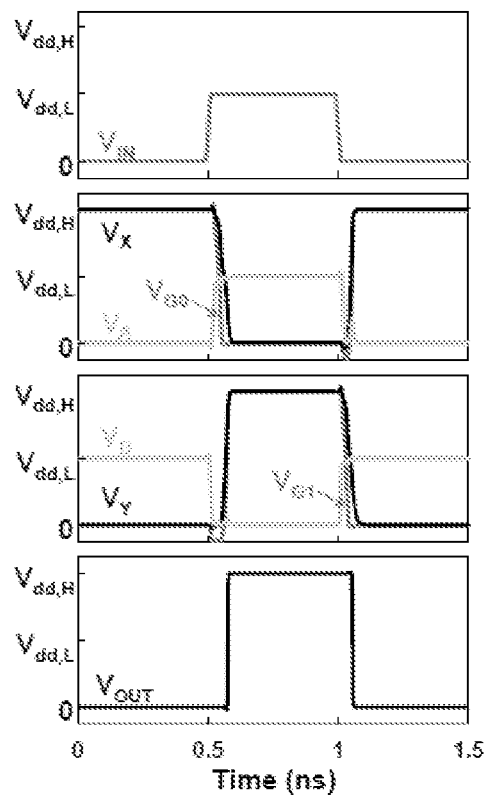

In the circuit of FIG. 5A, transistors M2 and M3 have been replaced by cross-coupled inverters that operate at the full $V_{dd,H}$ supply voltage. The NMOS devices utilized within the cross-coupled inverters are set to a sufficiently small size such that a low impedance path is provided to GND, without substantially impairing the drive strength of the PMOS devices utilized in the inverters.

Figure 6A:
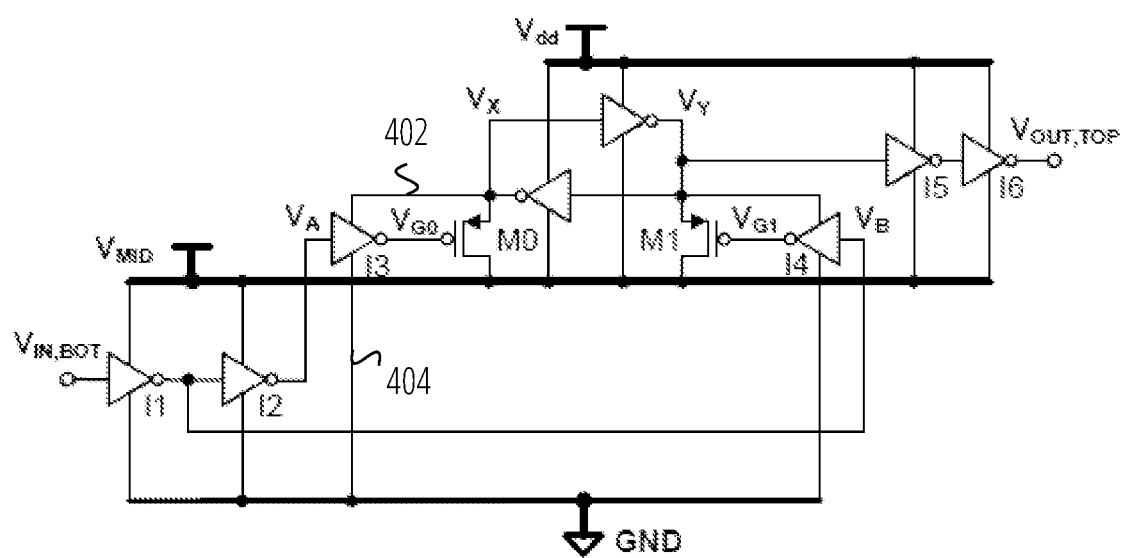
FIG. 6A and FIG. 6B depict another embodiment of a level-shifting circuit for transitioning digital signals from a lower voltage domain to a higher voltage domain.

FIG. 6A depicts an exemplary low-to-high level converter for use in a charge recycling data fabric. PMOS transistors are applied as pull-down transistors (M0 and M1). The drain connections of M0 and M1 are tied to a $V_{MID}$ supply rail set to a voltage $V_{dd}/2$. This restricts the voltage swing of the cross-coupled pair of inverters to be between $V_{dd}$ and $V_{dd}/2$, and thus decrease level conversion time.

Figure 6B:
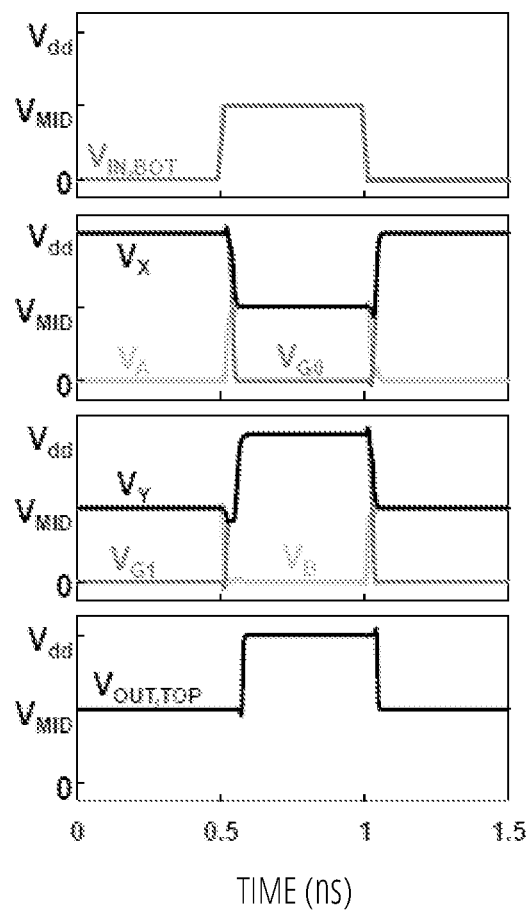

The gate voltages of pull-down transistors M0 and M1 are controlled by inverters I3 and I4, whose supplies are tied to internal nodes $V_X$ and $V_Y$. This means that the supply voltages of I3 and I4 shifts and the gate voltages of M0 and M1 switches to toggle or hold the latch state. Inverters I5 and I6 buffer the output signal between the $V_{dd}$ and $V_{MID}$ supply rails. Waveforms generated in the circuit of FIG. 6A are depicted in FIG. 6B.

Figure 7A:
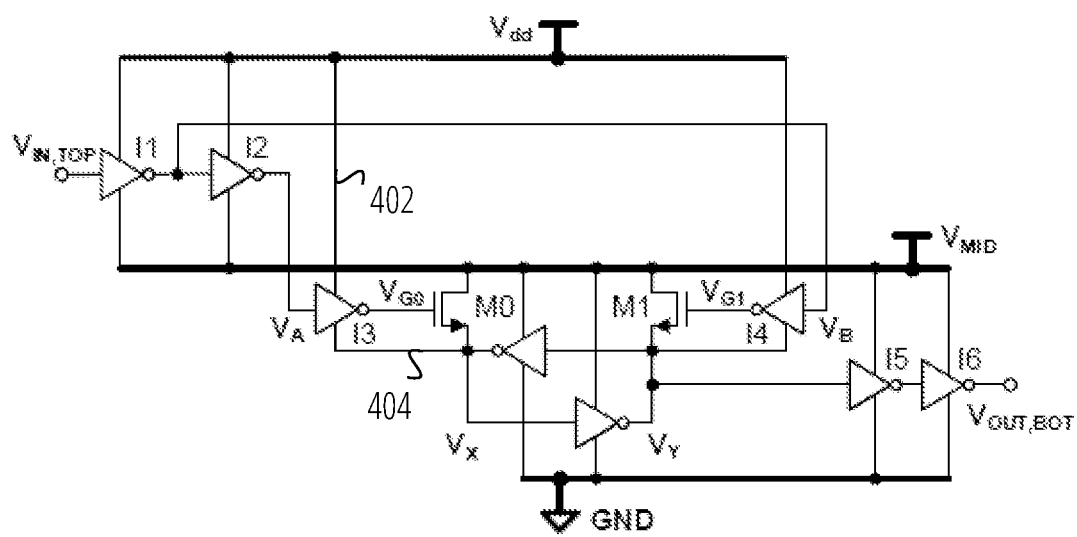
FIG. 7A and FIG. 7B depict an embodiment of a level-shifting circuit for transitioning digital signals from a higher voltage domain to a lower voltage domain.
Figure 7B:
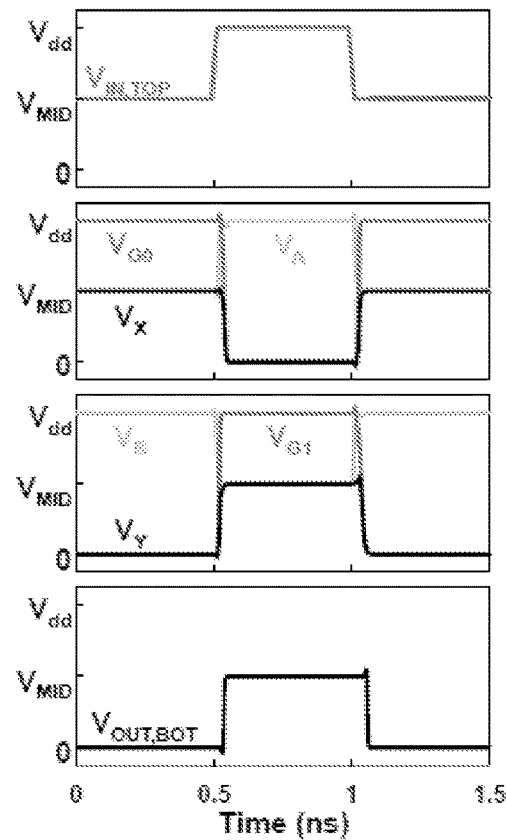

FIG. 7A depicts an exemplary high-to-low level converter for use in a charge recycling data fabric. This circuit embodiment complements the low-to-high level converter depicted in FIG. 6A. In the embodiment of FIG. 7A, NMOS transistors M0 and M1 are utilized as pull-up devices. The VDD terminal 402 and VSS terminal 404 connections of inverters I3 and I4 are tied to $V_{dd}$ and $V_X$ and $V_Y$ at the source terminals of control transistors M0 and M1, respectively. The cross-coupled inverter latch operates between $V_{dd}/2$ and GND. Gate voltages up to $V_{dd}$ are applied to M0 and M1 to toggle the latch state. The signal passes through inverters I5 and I6 which buffer the signal with half-supply amplitudes between $V_{dd}/2$ and GND. Waveforms generated in the circuit of FIG. 7A are depicted in FIG. 7B.

Figure 8A:
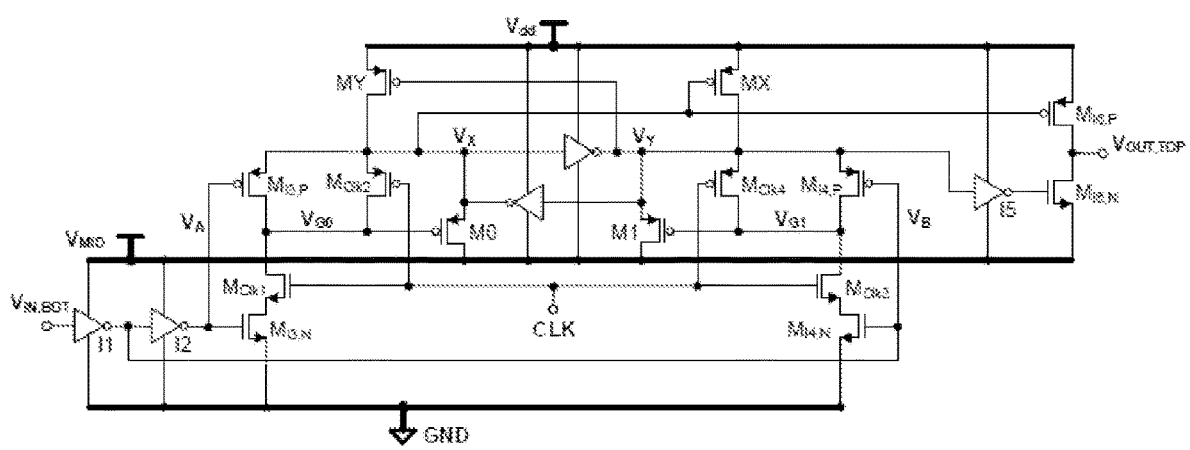
FIG. 8A and FIG. 8B depict an embodiment and waveforms for a level-shifting latch circuit for transitioning digital signals from a lower voltage domain to a higher voltage domain.
Figure 8B:
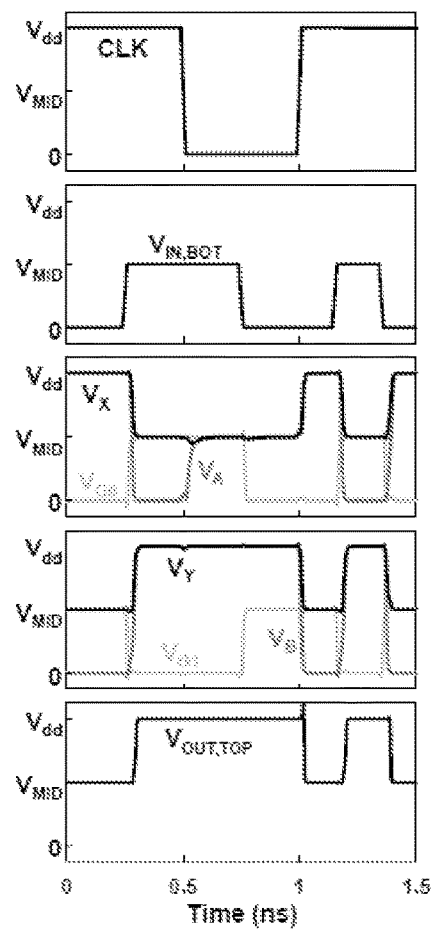

FIG. 8A and FIG. 8B depict a structure and corresponding waveforms for a low-to-high level-converting latch triggered by a falling edge of a full-scale clock (CLK) signal. The circuit uses a similar topology to the circuit in FIG. 6A with additional transistors to implement the functionality of a latch circuit and decrease signal transition time.

The clock signal controls the gate connections of M0 and M1 (VG0 and VG1 respectively) through switching transistors $M_{Clk1}$, $M_{Clk2}$, $M_{Clk3}$, and $M_{Clk4}$. When the clock signal is high (CLK=$V_{dd}$), $M_{Clk1}$ and $M_{Clk3}$ are switched ON to activate the pull-down paths within the moving supply inverters (the inverters implemented by the transistor pairs $M_{I3,P}$, $M_{I3,N}$ and $M_{I4,P}$, $M_{I4,N}$ respectively).

In this state, the latch is transparent. Signal level transitions at the input $V_{IN,BOT}$ alter the cross-coupled latch state through pull-down transistors M0 and M1. When the clock signal transitions low (CLK: $V_{dd} \rightarrow 0V$), the NMOS transistors of the moving supply inverters are disconnected while $V_{G0}$ and $V_{G1}$ are shorted to nodes $V_X$ and $V_Y$ respectively through transistors $M_{Clk2}$ and $M_{Clk4}$.

In this state, the latch is opaque and the cross-coupled inverters maintain the stored state. PMOS transistors $M_X$ and $M_Y$ (which need not be present in some embodiments) operate as pull-up switches, controlled by nodes $V_X$ and $V_Y$ respectively, to source additional current at the opposing nodes during signal transitions, and to decrease input-to-output signal propagation time. The NMOS and PMOS gate connections of the output inverter (the inverter implemented by the transistor pairs $M_{I6,P}$, $M_{I6,N}$) are separated and controlled by nodes $V_Y$ and $V_X$, respectively.

The gate of $M_{I6,P}$ is connected to node $V_X$ while the gate of $M_{I6,N}$ is buffered through inverter I5. This ensures the proper signal logic while enabling the capacitive loads at the $V_X$ and $V_Y$ nodes to be balanced for symmetric operation. Optionally, in another embodiment, the gate of $M_{I6,P}$ may be coupled to the output of inverter I5.

Figure 9A:
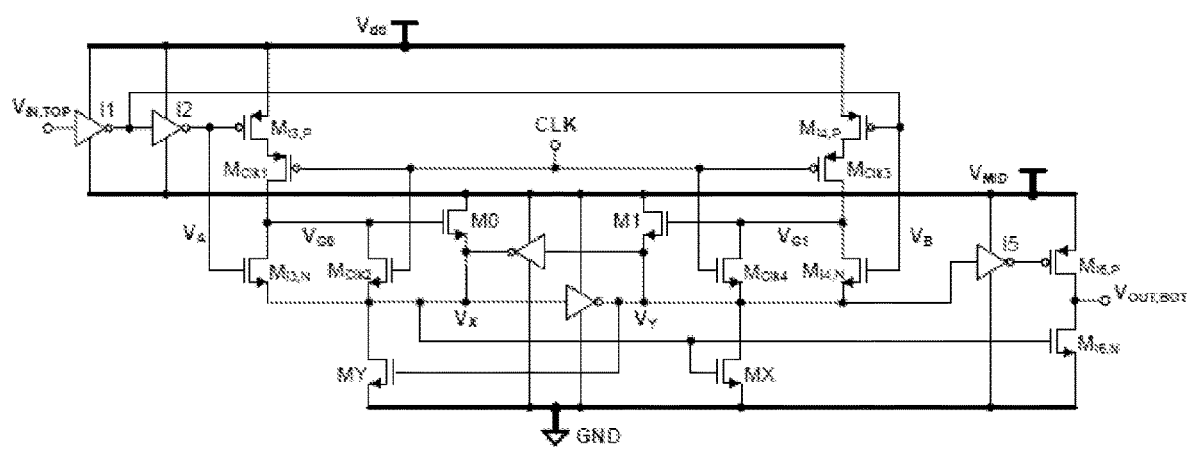
FIG. 9A and FIG. 9B depict another embodiment of a level-shifting latch circuit for transitioning digital signals from a higher voltage domain to a lower voltage domain.
Figure 9B:
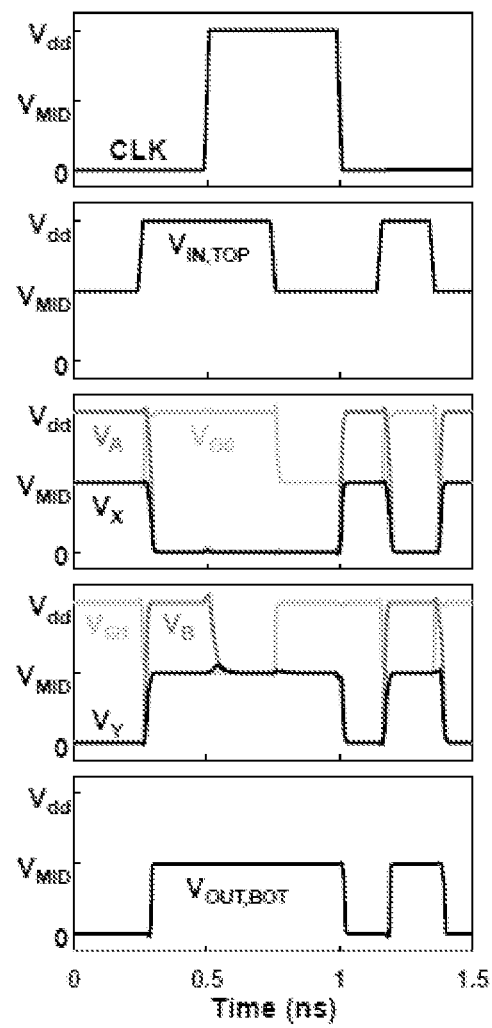

FIG. 9A and FIG. 9B depict a circuit embodiment and corresponding waveforms for a high-to-low level-converting latch triggered by a rising edge of a full-scale CLK signal. This circuit is complementary to the embodiment depicted in FIG. 8A. Its complementary operation may be readily understood in view of the description of FIG. 8A above.

LISTING OF DRAWING ELEMENTS

402 VDD terminal
404 VSS terminal

Various functional operations described herein may be implemented in logic that is referred to using a noun or noun phrase reflecting said operation or function. For example, an association operation may be carried out by an "associator" or "correlator". Likewise, switching may be carried out by a "switch", selection by a "selector", and so on. "Logic" refers to machine memory circuits and non-transitory machine readable media comprising machine-executable instructions (software and firmware), and/or circuitry (hardware) which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware are examples of logic. Logic specifically excludes pure signals or software per se (however does not exclude machine memories comprising software and thereby forming configurations of matter).

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, claims in this application that do not otherwise include the "means for" [performing a function] construct should not be interpreted under 35 U.S.C § 112(f).

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

As used herein, a recitation of "and/or" with respect to two or more elements should be interpreted to mean only one element, or a combination of elements. For example, "element A, element B, and/or element C" may include only element A, only element B, only element C, element A and element B, element A and element C, element B and element C, or elements A, B, and C. In addition, "at least one of element A or element B" may include at least one of element A, at least one of element B, or at least one of element A and at least one of element B. Further, "at least one of element A and element B" may include at least one of element A, at least one of element B, or at least one of element A and at least one of element B.

The subject matter of the present disclosure is described with specificity herein to meet statutory requirements. However, the description itself is not intended to limit the scope of this disclosure. Rather, the inventors have contemplated that the claimed subject matter might also be embodied in other ways, to include different steps or combinations of steps similar to the ones described in this document, in conjunction with other present or future technologies. Moreover, although the terms "step" and/or "block" may be used herein to connote different elements of methods employed, the terms should not be interpreted as implying any particular order among or between various steps herein disclosed unless and except when the order of individual steps is explicitly described.

Having thus described illustrative embodiments in detail, it will be apparent that modifications and variations are possible without departing from the scope of the invention as claimed. The scope of inventive subject matter is not limited to the depicted embodiments but is rather set forth in the following Claims.

What is claimed is:

1. A voltage level-conversion circuit comprising:
   a first PMOS pull-down device and a second PMOS pull-down device;
   a first inverter and a second inverter, wherein the level-conversion is provided by coupling an output of each inverter to a gate of the first PMOS pull-down device and to a gate of the second PMOS pull-down device, respectively; and
   the circuit configured such that the first inverter and the second inverter are powered by moving supply voltages.

2. The voltage level-conversion circuit of claim 1, wherein the level-conversion is between a first power supply domain and a second power supply domain.

3. The voltage level-conversion circuit of claim 2, wherein the PMOS pull-down devices are each configured to pull-down to a circuit ground voltage level common to both power supply domains.

4. The voltage level-conversion circuit of claim 2, wherein the PMOS pull-down devices are each configured to pull-down to the power supply voltage of the first power supply domain.

5. The voltage level-conversion circuit of claim 1, wherein the moving supply voltages are power supply voltages for the inverters.

6. The voltage level-conversion circuit of claim 1, further comprising:
   a cross-coupled PMOS pair configured to provide the moving supply voltages to the first inverter and to the second inverter.

7. The voltage level-conversion circuit of claim 6, wherein the PMOS pull-down devices are each individual PMOS transistors.

8. The voltage level-conversion circuit of claim 1, further comprising:
   a cross-coupled inverter pair configured to provide the moving supply voltages to the first inverter and to the second inverter.

9. A voltage level-conversion circuit comprising:
   a first NMOS pull-up device and a second NMOS pull-up device;
   a first inverter and a second inverter, wherein the level-conversion is provided by coupling an output of each inverter to a gate of the first NMOS pull-up device and to a gate of the second NMOS pull-up device, respectively; and
   the circuit configured such that the first inverter and the second inverter are powered by moving supply voltages.

10. The voltage level-conversion circuit of claim 9, wherein the level-conversion is between a first power supply domain and a second power supply domain.

11. The voltage level-conversion circuit of claim 10, wherein the level-conversion is from a higher-voltage ground domain to a lower-voltage ground domain.

12. The voltage level-conversion circuit of claim 10, wherein the NMOS pull-up devices are each configured to pull-up to the power supply voltage of the second power supply domain.

13. The voltage level-conversion circuit of claim 9, further comprising:
   a cross-coupled NMOS pair configured to provide the moving supply voltages to the first inverter and to the second inverter.

14. The voltage level-conversion circuit of claim 9, further comprising:
   a cross-coupled inverter pair configured to provide the moving supply voltages to the first inverter and to the second inverter.

15. A voltage level-conversion circuit comprising:
   a first PMOS pull-down device and a second PMOS pull-down device;
   a latch; and
   the circuit configured such that the level-conversion is provided by gate control voltages of the first PMOS pull-down device and the second PMOS pull-down device, the gate control voltages determined by a data value stored in the latch.

16. A voltage level-conversion circuit comprising:
   a first NMOS pull-up device and a second NMOS pull-up device;
   a latch; and
   the circuit configured such that the level-conversion is provided by gate control voltages of the first NMOS pull-up device and the second NMOS pull-up device, the gate control voltages determined by a data value stored in the latch.

17. A voltage-level conversion process between a first power domain and a second power domain, the process comprising:
   driving, with inverters, gates of one of (a) a plurality of PMOS pull-down devices, and (b) a plurality of NMOS pull-up devices; and
   powering the inverters with moving supply voltages.

18. The voltage level-conversion process of claim 17, wherein the PMOS pull-down devices are each configured to pull-down to a circuit ground voltage level common to the first power supply domain and the second power supply domain.

19. The voltage level-conversion process of claim 17, wherein the moving supply voltages are power supply voltages for the inverters.

20. The voltage level-conversion circuit of claim 17, wherein the moving supply voltages are ground terminal voltages for the inverters.

* * * * *